United States Patent
Seeger

(10) Patent No.: US 11,982,697 B2
(45) Date of Patent: May 14, 2024

(54) RF VECTOR MEASUREMENT SYSTEM WITH ONE OR MORE ENTANGLED QUANTUM SENSORS

(71) Applicant: Rohde & Schwarz GmbH & Co. KG, Munich (DE)

(72) Inventor: Julius Seeger, Prien am Chiemsee (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 328 days.

(21) Appl. No.: 17/560,888

(22) Filed: Dec. 23, 2021

(65) Prior Publication Data

US 2023/0204645 A1    Jun. 29, 2023

(51) Int. Cl.
| | |
|---|---|
| *G01R 27/28* | (2006.01) |
| *G01R 29/02* | (2006.01) |
| *G06N 10/40* | (2022.01) |
| *G06N 10/70* | (2022.01) |
| *H04B 10/079* | (2013.01) |
| *H04B 10/11* | (2013.01) |
| *H04B 10/70* | (2013.01) |

(52) U.S. Cl.
CPC ............ *G01R 29/02* (2013.01); *G06N 10/40* (2022.01)

(58) Field of Classification Search
CPC ........ G01R 27/28; G01R 29/02; G06N 10/40; G06N 10/70; H04B 10/079; H04B 10/11; H04B 10/70
See application file for complete search history.

(56) References Cited

U.S. PATENT DOCUMENTS 10,007,885 B1    6/2018    Gorshkov et al.

FOREIGN PATENT DOCUMENTS

| WO | 2021077041 A1 | 4/2021 | |
|---|---|---|---|
| WO | WO-2021077041 A1 * | 4/2021 | ............. G01S 3/043 |

* cited by examiner

*Primary Examiner* — Neel D Shah
(74) *Attorney, Agent, or Firm* — DITTHAVONG, STEINER & MLOTKOWSKI

(57) ABSTRACT

The application discloses a RF vector measurement system including: a first port for generating a RF pulse, a pulse splitter for splitting the pulse into a first pulse send to a device-under-test DUT, and a second pulse send as a reference to a first quantum sensor of the system. The system is arranged to supply a third pulse, which is produced by reflecting or transmitting the first by the DUT, to at least one second quantum sensor phase-correlated with said first quantum sensor by entanglement. A computing unit is arranged to perform a measurement of the DUT by: reading out the state of the population of the first and the second quantum sensor, wherein the state of the second quantum sensor is based on the relative phase and relative amplitude of the second pulse and the third pulse, and determining the relative phase and relative amplitude of the second pulse and the third pulse as the closest match when applying a quantum sensor model for the second quantum sensor, the model being designed to model the dependencies between the relative phase and amplitude and the resulting population state.

20 Claims, 3 Drawing Sheets

RF VECTOR MEASUREMENT SYSTEM WITH ONE OR MORE ENTANGLED QUANTUM SENSORS

TECHNICAL FIELD

Network analyzers currently rely on phase coherent distribution of a local oscillator source to the different ports of a receiver. For higher operating frequencies phase noise and therefore displayed trace noise is increased. As the physical distance between the different ports grows, environmental issues lead to higher disturbances and degrade the coherence/phase stability.

On the other hand, quantum sensing is a rapidly growing field of research and continuously getting more and more attention. Different quantum systems such as single atoms, ions, ensembles of cold atoms, atomic vapors, quantum dots, etc. are used today to realize sensing of frequencies, magnetic and electric fields, acceleration, orientation in space etc. Considering the detection of electromagnetic waves, the possible frequency bands go beyond the in semiconductors available today. However, the increased sensitivity of quantum systems makes them fragile as already known from digital quantum computers. Furthermore, quantum systems underlie a continuous time evolution which is not directly detectable, but can have a fundamental impact on the measurement outcome as known from different spectroscopy techniques.

For a vector network analyzer, it is highly important that the source and receiver e.g. for an S21 measurement share a common, phase coherent local oscillator. In the time domain this means that the time where the wave leaves the source port is known and is used as a reference point for the measurement at later time (propagation delay) at the distant receiver.

BACKGROUND ART

U.S. Ser. No. 10/007,885 discloses the determination of a modal amplitude of an inhomogeneous field with a quantum sensor.

WO2021077041A1 discloses entangled radiofrequency-photonic sensor systems and methods.

"Entanglement enhanced quantum sensing", Proceedings of SPIE—The International Society for Optical Engineering January 2010, teaches how entangled photons can be employed for quantum enhanced measurements.

SUMMARY

It is the object of the present invention to enable improved vector measurement without the need for a local oscillator LO. This object is achieved by means of the features of the independent claims. The dependent claims develop further the central idea of the invention.

A first aspect relates to RF vector measurement system (vector network analyzer), comprising:
- a first port for generating a RF pulse ("RF pulse" being a RF signal lasting a given time period, which typically is at least the time period of the measurement) and,
- a pulse splitter for splitting the pulse into a first pulse send to a device-under-test DUT, and a second pulse send as a reference to a quantum sensor of the system,
- wherein the system is arranged to supply a third pulse, which is produced by reflecting or transmitting the first by the DUT, to said quantum sensor,
- a computing unit is arranged to perform a measurement of the DUT by:
- reading out the state of the population of the quantum sensor, which state is based on the relative phase and relative amplitude of the second pulse and the third pulse, and
- determining the relative phase and relative amplitude of the second pulse and the third pulse as the closest match when applying a quantum sensor model designed to model the dependencies between the relative phase and amplitude and the resulting population state.

Another aspect relates to a RF vector measurement system (vector network analyzer), comprising:
- a first port for generating a RF pulse (RF pulse being a RF signal lasting a given time period, which typically is at least the time period of the measurement),
- a pulse splitter for splitting the pulse into a first pulse send to a device-under-test DUT, and a second pulse send as a reference to a first quantum sensor of the system,
- wherein the system is arranged to supply a third pulse, which is produced by reflecting or transmitting the first by the DUT, to at least one second quantum sensor phase-correlated with said first quantum sensor by entanglement,
- a computing unit arranged to perform a measurement of the DUT by:
- reading out the state of the population of the first or the second quantum sensor, wherein the state of the second quantum sensor is based on the relative phase and relative amplitude of the second pulse and the third pulse, and
- determining the relative phase and relative amplitude of the second pulse and the third pulse as the closest match when applying a quantum sensor model for the first or the second quantum sensor, the model being designed to model the dependencies between the relative phase and amplitude and the resulting population state.

The closest match may be based on a least-square methods. The quantum sensor may use different quantum system means, e.g. a gas in the quantum sensor, a superconducting unit, a quantum dot, etc. The model used is specific for the system. The model can be numerical or analytical.

The first pulse preferably is a continuous pulse signal (i.e. as a continuous load to the DUT) and the second pulse preferably is supplied as a non-continuous pulse signal to the first quantum sensor.

The system may comprise a delay line for the first pulse and/or third pulse. Where travel distances of the first and/or third pulse are low, it can be difficult to distinguish between propagation delay and the phase difference. The delay line increases the phase sensitivity.

The computing unit may be arranged to sequentially or parallel perform two measurements with a 90 degree phase shift between the two measurements.

As the phase determination is limited to an interval between 0 and pi, this limitation can be overcome by a second measurement (same measurement twice) using e.g. shift receiver path of the device by pi/2 for the I/Q demodulation.

For the first pulse a Ramsey type pulse sequence may be used.

The first quantum sensor and the at least one second quantum sensor may be entangled for stretched population states. This reduces the standard deviation of the measurement.

The control unit may be arranged to:
squeeze the first pulse and measure the amplitude and measure the amplitude, or
increase the amplitude noise and measure the phase.

To determine the phase, the system may comprise an amplifier to drive the signal into compression so that amplitude is saturated.

The control unit may be designed to produce a multi-frequency first pulse, preferably to determine the frequency response for several frequencies in the pulse at the same time.

The system may be arranged to entangle the first quantum sensor and the at least one second quantum sensor by laser pulses or microwave pulses of a coherent pulse source of the system. E.g. Raman couplings or nuclear scattering partners may be used.

The frequency of the entanglement may be lower than the frequency of the signal to be measured (first pulse) and lower than the rad-out frequency. E.g. the entanglement frequency may be between 5 and 10 GHz, preferably 6 to 7 Ghz and the readout frequency between 50 and 150 GHz. Preferably the readout frequency is at least 5 times, preferably 10 times the entanglement frequency.

A still further aspect relates to a RF vector measurement method, comprising:
generating a RF pulse (RF pulse being a RF signal lasting a given time period, which typically is at least the time period of the measurement),
splitting the pulse into a first pulse send to a device-under-test DUT, and a second pulse send as a reference to a quantum sensor of the system,
wherein a third pulse, which is produced by reflecting or transmitting the first by the DUT, is supplied to said quantum sensor,
as a measurement, reading out the state of the population of the quantum sensor, which state is based on the relative phase and relative amplitude of the second pulse and the third pulse, and
determining the relative phase and relative amplitude of the second pulse and the third pulse as the closest match when applying a quantum sensor model designed to model the dependencies between the relative phase and amplitude and the resulting population state.

Yet another aspect relates to a RF vector measurement method, comprising:
generating a RF pulse (RF pulse being a RF signal lasting a given time period, which typically is at least the time period of the measurement),
splitting the pulse into a first pulse send to device-under-test DUT, and a second pulse send as a reference to a first quantum sensor of the system,
supplying a third pulse, which is produced by reflecting or transmitting the first by the DUT, to at least one second quantum sensor phase-correlated with said first quantum sensor by entanglement,
as a measurement, reading out the state of the population of the first quantum sensor or the second quantum sensor, wherein the state of the second quantum sensor is based on the relative phase and relative amplitude of the second pulse and the third pulse, and
determining the relative phase and relative amplitude of the second pulse and the third pulse as the closest match when applying a quantum sensor model for the second quantum sensor, the model being designed to model the dependencies between the relative phase and amplitude and the resulting population state.

BRIEF DESCRIPTION OF THE DRAWINGS

Further aspects of the invention will now be explained by means of non-limiting embodiments and referring to the figures of the enclosed drawings.

The invention proposes the use a quantum system as receiver to determine amplitude and phase properties of electromagnetic waves. The receiver itself works as local oscillator due to its intrinsic coherence. Preferably a single pulse source is used for reduced phase noise. ("pulse" being a RF signal lasting a given time period, which typically is at least the time period of the measurement).

Different quantum systems for different target frequencies of the electromagnetic wave to be analysed, e.g.

| Atoms/Ions: | kHz to several GHz, THz |
|---|---|
| Rydberg states: | GHz |
| Quantum dots: | THz |
| Superconducting Q-Bits: | GHz |
| Quantum mechanical oscillators: | kHz to MHz |

DETAILED DESCRIPTIONS OF EMBODIMENTS

Figure 1:
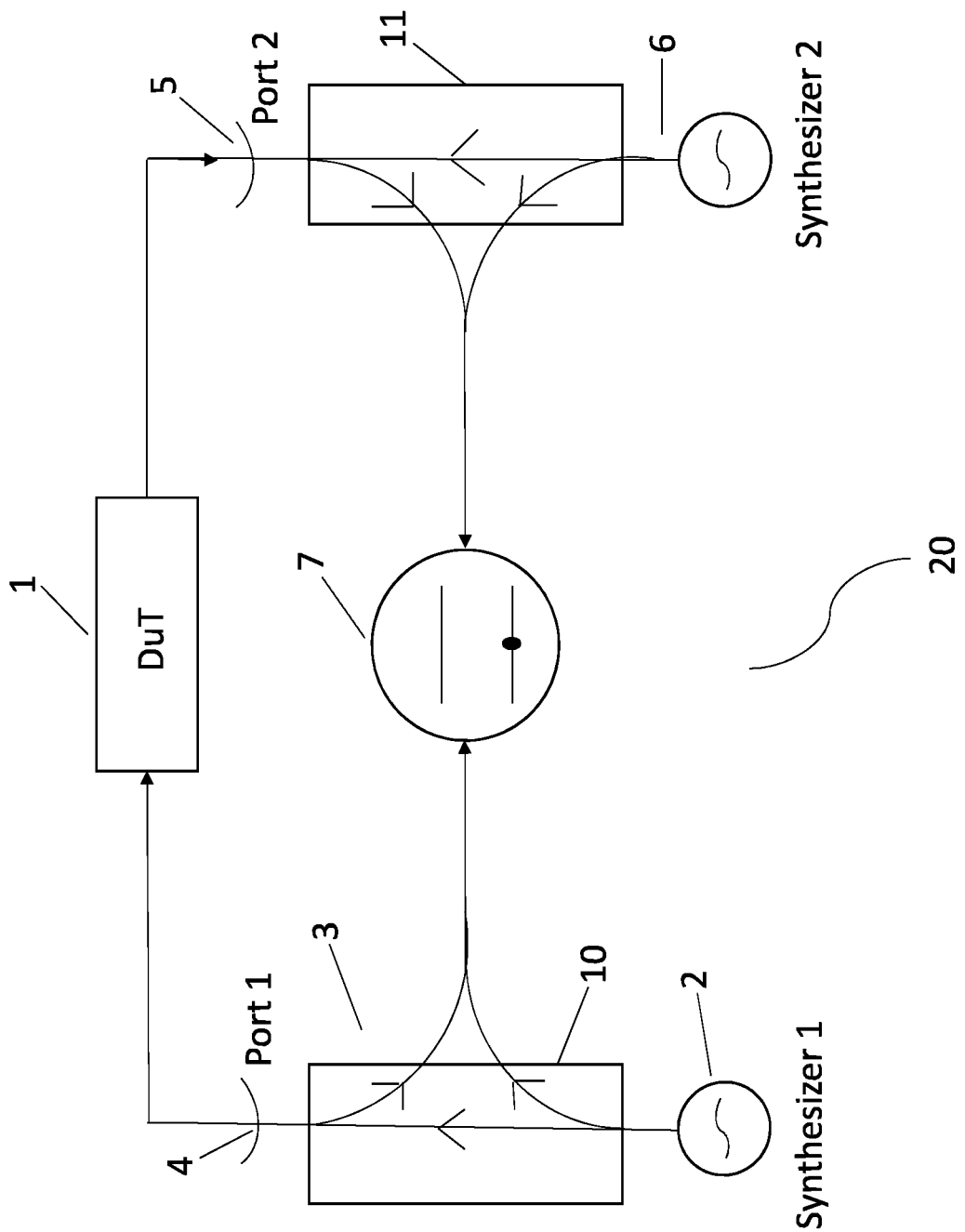
FIG. 1 shows an embodiment of a RF vector analysis device using a single quantum sensor

A first embodiment of the invention will now be explained with reference to FIG. 1. This embodiment is based on the use of a single quantum sensor 7 for analyzing especially the phase and amplitude characteristics of an electromagnetic RF signal transmitted or reflected by a device under test (DUT1).

According to this embodiment two preferably coherent RF signal sources 2, 6 (synthesizer 1, synthesizer 2) are provided. These signal sources 2, 6 respectively produce a first pulse signal, which is split by respective splitters 10, 11 ("pulse" being a RF signal lasting a given time period, which typically is at least the time period of the measurement). A part of the first pulse, called second pulse signal is supplied to a DUT1 at respective ports 4, 5 of the vector analyzer system, which is generally designated with 20 in FIG. 1.

The splitter produces furthermore respectively a second pulse signal, which is supplied to a quantum sensor 7.

Further, the pulse signals reflected or transmitted by the DUT1 are also coupled, as third pulse signals to the quantum sensor 7.

Figure 2:
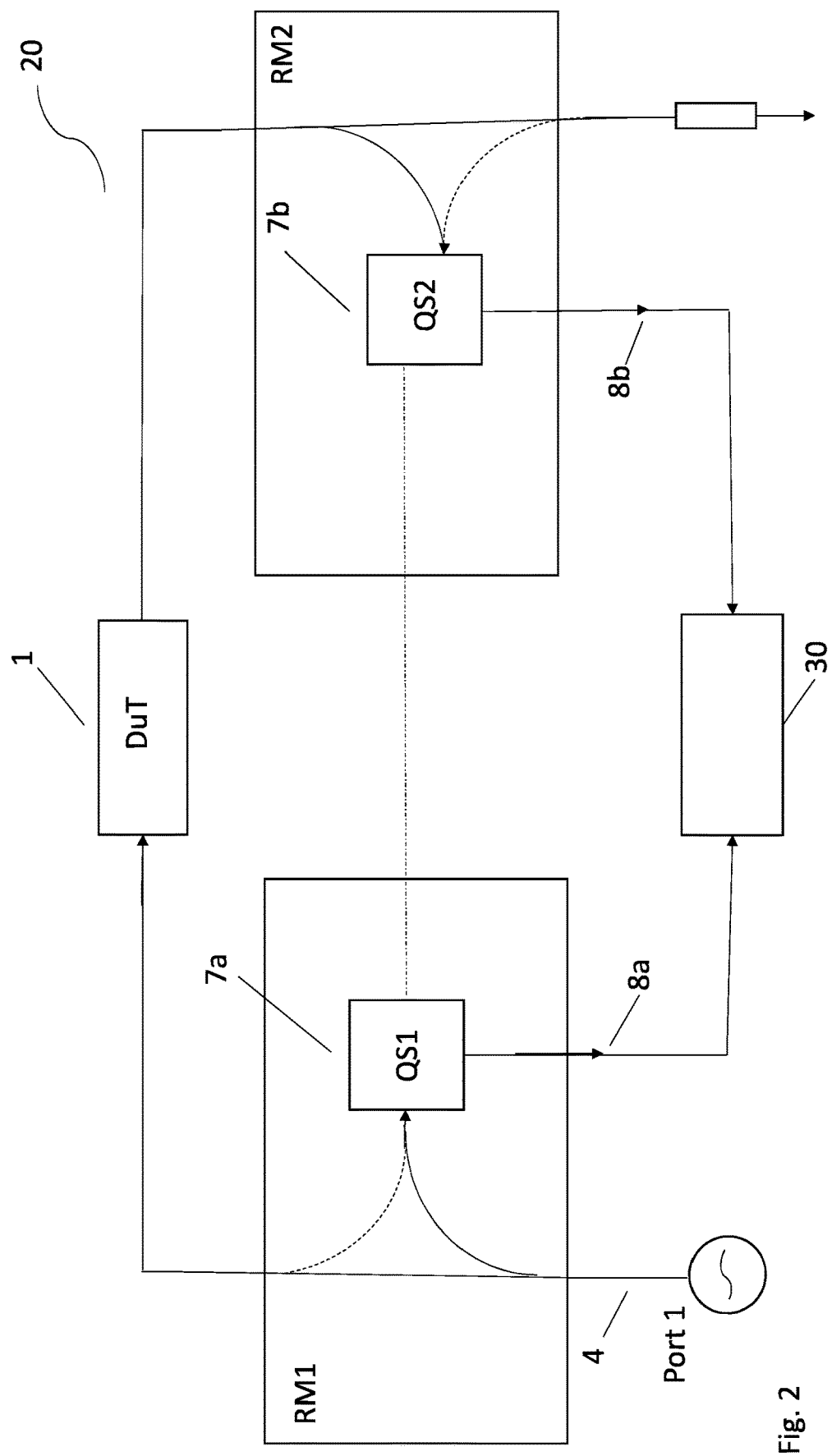
FIG. 2 shows an embodiment of a RF vector analysis device using at least two entangled quantum sensors.

FIG. 2 schematically shows an embodiment in which a plurality of entangled quantum sensors, in the shown example a first quantum sensor QS17A and a second quantum sensor QS27B are shown.

Population states of the first quantum sensor 7A are read out by a readout line 8A connected to a control circuit generally referenced with 30. Population states of the second, entangled, quantum sensor 7B are read out by a readout line 8B also connected to the control circuit 30.

Using entangled states of the quantum sensor 7A, 7B overcomes the problem of synchronization.

Figure 3:
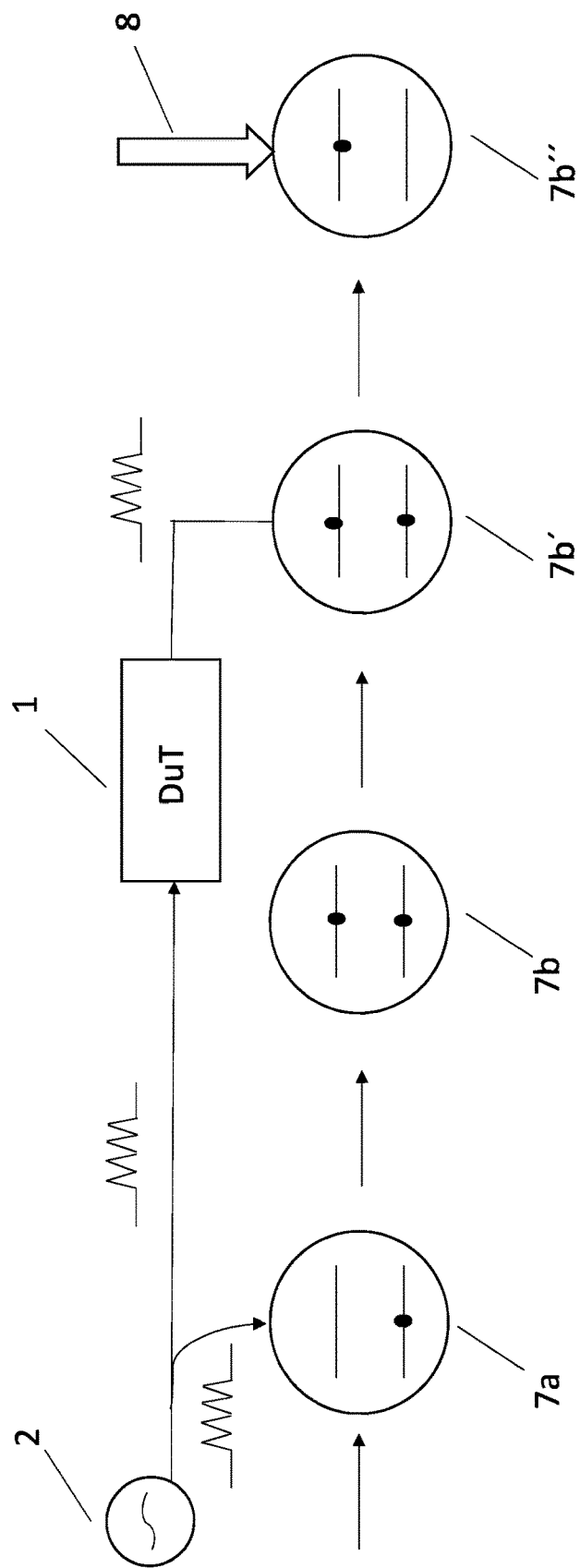
FIG. 3 illustrates the operation of a RF vector analysis device using at least two entangled quantum sensors.

FIG. 3 now explains an operation of the embodiment of FIG. 2 with two entangled quantum sensors 7A, 7B. At first, the quantum sensor 7A and 7B at the source port RM1, and the receiver port RM2, respectively, are initialized and an entanglement between them is established. This can be done either via entanglement at a single point in space and transport of this system to the different ports afterwards or the entanglement can be established via coupling of the remote positioned ports RM1, RM2. Typically, this is done using RF fields or laser fields to couple specific states with a quantum sensor 7A, 7B.

While ions can be easily handled via electric fields, neutral atoms can only be transported in space via high intense fields, and quantum dots on semiconductor surfaces cannot be moved in any way. However, in all of these examples for quantum sensors, entanglement can be achieved. As establishing entanglement via RF coupling needs a stable, coherent oscillator distribution, there seems to be no advantage to prior art RF approaches. However, frequencies for establishment of the entangled states can differ (i.e. can be substantially lower) from the target frequency (readout frequency) of the receiver port RM2 itself. Phase noise accumulation due to massive frequency multiplication is avoided, which results in better coherence properties.

Once both entangled quantum sensors QS7A, QS7B reach the respective ports RM1, RM2 for example a S21 measurement can be started.

As shown in FIG. 2, a known fraction of the outgoing wave is fed to the first quantum sensor QS1 at port RM1. Measurement and readout of the quantum sensor states at this port leads intrinsically to a collapse of the overall way function. Due to the entanglement of both sensors QS7A, QS7B, measuring the outgoing wave properties initializes the second quantum sensor 7B instantaneously without any delay in the receiving port RM2. Additionally, the initial state of the second quantum sensor 7B is also known since the engineered entanglement determines the state correlation.

As time evolves (see the transmissions from 7B to 7B' in FIG. 3) and the wave is travelling from the source port RM1 through the DUT1 to the receiver port RM2, the sensing state QS2 evolves in time as demonstrated schematically by 7B and 7B' in FIG. 3. The measurement at the receiving port RM2 depends on the initial state of the quantum sensor 7A, 7B and thus has to be known. Measuring on the entangled complementary at the quantum sensor QS17A has two benefits:

a) The initial state in the receiving port quantum sensor 7B is instantaneously determined without any delay, as soon as the source wave is leaving the source port RM1 due to the measurement at the source port RM1. Therefore, there are any environmental conditions, which interfere with the statements since this is an intrinsic property of quantum mechanics. Therefore, the proposed scheme is completely robust against temperature drifts, physical distance between the ports RM1, RM2 etc., which guarantees better performance compared to prior art devices.

b) Measuring of the quantum state of the quantum sensors 7A, i.e. reading out the population state via the readout line 8A connected to the control circuit 30, gives, due to the entanglement, access to the reference state in the quantum sensor 7B without any other measurement or any common local oscillator of both ports RM1, RM2.

According to the invention, the device and method of operation can be extended using a higher number of entangled stated for multiport analyzers, where all ports would be initialized and synchronized (entangled) at once. Measuring reflections, such as for example S11 parameters can also be performed, for example using a Ramsey-type pulse sequence, known as such from spectroscopy and nuclear-magnetic resonance phenomena.

Using a plurality of entangled quantum sensors 7A, 7B within one port enables measurements in parallel, which decreases the sweep time or increases the signal-to-noise ratio. Measurements with traditional network analyzers without quantum sensor receivers lead to a square-route behavior of the measurement error. I.e. in the known network analyzers of the prior art doing twice the measurements in parallel or double the measurements time leads to reduction of the measurement uncertainty to 1/SQRT (2)=0.7.

On the other hand, using the entangled quantum sensor 7A, 7B of the invention in parallel for the measurement, the intrinsic correlation of the receivers decreases the uncertainty in a linear manner. Doubling the measurement time or doing twice the number of sweeps reduces the measurement error to 0.5, which is an improvement of the signal-to-noise ratio of 35% when using a constant sweep time, or a 35% faster measurement (reduced sweep time) for the same signal-to noise performance.

In the following different examples as how to operate such vector network analyzers with entangled receivers (quantum sensors) are explained.

Example A: According to this example one single quantum sensor is provided, which is shared by the source and the receiving port. There is no entanglement.

In a step 1, the quantum sensor, which may be a two-state system, is initialized, for example by preparing the state 10.

In step 2, the electromagnetic wave signal is sourced by the source synthesizer and supplied to the output port (source port) as well as to the quantum sensor.

The coupling of the quantum sensor to the receiver leads to a super position of the states 10 and 1 of the quantum sensor. Preferably, a pi/2 pulse signal is realized. Correspondingly, the pulse length and the pulse form are matched.

In a step 3, the outgoing wave is made to travel to the device under test (DUT), where it can be either transmitted or reflected. In either case, the amplitude and phase of the wave can be altered. For example, in case of a reflection, the incoming wave at the source port is guided to the quantum sensor. In the case of a transmission of the wave through the DUT, the transmitted wave arriving at another port (receiving port) is used.

Assuming that the roundtrip time of this signal can be neglected, the second coupling of the RF wave with the quantum sensor uses the intermediate state as initial wave function.

In a step 4, the final state population of the quantum sensor are readout. Methods for reading out state populations of quantum sensors are known as such.

In a step 5, the read-out state population is matched with a combination of amplitude and phase via comparison with the theoretical model of the quantum sensor.

In the described process, in order to determine the phase and the full interval of between 0 and pi/2, it is advantageous to use another receiver, a modified receiver, wherein the signal transmission path at a pi/2 phase shift to the RF signal.

In a modification of the described method, the process can be repeated for various pulse length/RF phases to increase the sensitivity for the amplitude determination.

The described operation can be used with a multitude of receivers in parallel, where receivers are detuned relative to each other. This allows the vector analysis of the whole spectrum and enables especially vector network analysis at different frequencies within a single measurement. In this context, for example an inhomogeneous magnetic field and an atomic state quantum sensor could be used. Due to the atomic resonances at different local positions, the measurement results (phase and amplitude values) can be mapped to the different frequencies contained within one single pulse of the signal to be analyzed.

Now a further example B of the present invention is explained in which the vector network analyzer comprises two entangled quantum sensors.

In step 1, the quantum sensors are initialized with their entanglement.

In a step 2, a RF wave is sourced by the synthesizer coupled to the output as well as to the first entangled quantum sensor.

In a step 3, the outgoing wave travels through the DUT and arrives phase- and amplitude-shifted at the receiving port. Then it is guided to the second entangled quantum sensor.

In case there is only a phase shift and no amplitude change in the DUT, the second coupling will lead to a defined final state.

In step 4, the final state population, either of quantum sensor 1 or quantum sensor 2, is readout via known measurement methods, such as for example absorption imaging.

Note that the reading out of the final state population can be done either at quantum sensor 1 or quantum sensor 2, since the phase information is encoded in the probability amplitudes of the basis states.

In a step 5, the measured populations are matched via a theoretical model, to the most likely phase and amplitude of the wave modified by the DUT.

Normally also the amplitude will be changed by the DUT, which directly influences the probabilities. To distinguish phase and amplitude, a 90°-shifted receiver path may be used, and/or pulse strains with different pulse lengths and/or pulse amplitudes/powers may be used.

Now a further example C will be explained, in which the network analyzer comprises two entangled quantum sensors and is adapted for amplitude measurement only.

Again, in a step 1, the quantum sensors with the entanglement are initialized.

In a step 2, the wave is sourced by the synthesizer coupled to the output port and the first entangled quantum sensor.

In a step 3, a measurement, i.e. a readout of the quantum sensor 1 is performed. Thereby, the entanglement and wave function collapses simultaneously at both sensors.

In a step 4, the pulse travels through the DUT and arrives at the receiving port and is then coupled to the second, now detangled quantum sensor. Due to the collapse to an eigenstate, the second quantum sensor is only sensitive to the amplitude of the incoming wave. Note that this example is useful in cases where a lot of noise is present, as it resets the quantum sensor 2 at the moment where the wave actually leaves the source port.

This measurement can be optionally combined with the measurement as explained with reference to example 2, as it reduces the model fitting in that case to that of the amplitude since the amplitude was measured independently by destroying the entanglement of the quantum sensors.

Now an example D will be explained, in which the device has two entangled quantum sensors, and additionally an auxiliary measurement system.

Again, in a step 1, the entangled quantum sensors are initialized by entanglement.

In a step 2, the wave is sourced by the synthesizer coupled to the output port and to the first quantum sensor.

In a step 3, the first quantum sensor is coupled to another none-quantum or quantum measurement system, which allows to detect the quantum state of the first quantum sensor without probing itself.

In a step 4, the measurement by using the auxiliary system is performed to determine the state of the first quantum sensor.

In a step 5, the wave is made to travel through the DUT and arrives phase- and amplitude-shifted at the second quantum sensor. As in example B, the phase and amplitude probabilities can be determined.

The invention claimed is:

1. A RF vector measurement system, comprising:
a first port for generating a RF pulse,
a pulse splitter for splitting the pulse into a first pulse send to a device-under-test DUT, and a second pulse send as a reference to a quantum sensor of the system,
wherein the system is arranged to supply a third pulse, which is produced by reflecting or transmitting the first by the DUT, to said quantum sensor,
a computing unit is arranged to perform a measurement of the DUT by:
reading out the state of the population of the quantum sensor, which state is based on the relative phase and relative amplitude of the second pulse and the third pulse, and
determining the relative phase and relative amplitude of the second pulse and the third pulse as the closest match when applying a quantum sensor model designed to model the dependencies between the relative phase and amplitude and the resulting population state.

2. The system of claim 1, wherein the first pulse is a continuous pulse signal and the second pulse is processed to a non-continuous pulse signal before being supplied to the first quantum sensor.

3. The system of claim 1, comprising a delay line for the first pulse and/or third pulse.

4. The system of claim 1, wherein the computing unit is arranged to sequentially or parallel perform two measurements with a 90 degree phase shift between the two measurements.

5. The system of claim 1, wherein for the first pulse a Ramsey type pulse sequence is used.

6. The system of claim 1, wherein the control unit is arranged to:
squeeze the first pulse and measure the amplitude and measure the amplitude, or
increase the amplitude noise and measure the phase.

7. The system of claim 1, wherein the control unit is designed to produce a multi-frequency first pulse, preferably to determine the frequency response for several frequencies in the pulse at the same time.

8. A RF vector measurement method, comprising:
generating a RF pulse,
splitting the pulse into a first pulse send to a device-under-test DUT, and a second pulse send as a reference to a quantum sensor of the system,
wherein a third pulse, which is produced by reflecting or transmitting the first by the DUT, is supplied to said quantum sensor,
as a measurement, reading out the state of the population of the quantum sensor, which state is based on the relative phase and relative amplitude of the second pulse and the third pulse, and determining the relative phase and relative amplitude of the second pulse and the third pulse as the closest match when applying a quantum sensor model designed to model the dependencies between the relative phase and amplitude and the resulting population state.

9. A RF vector measurement system, comprising:
a first port for generating a RF pulse,
a pulse splitter for splitting the pulse into a first pulse send to device-under-test DUT, and a second pulse send as a reference to a first quantum sensor of the system,
wherein the system is arranged to supply a third pulse, which is produced by reflecting or transmitting the first by the DUT, to at least one second quantum sensor phase-correlated with said first quantum sensor by entanglement,
a computing unit arranged to perform a measurement of the DUT by:
  reading out the state of the population of the first quantum sensor or the second quantum sensor, wherein the state of population of the first quantum sensor or the second quantum sensor is based on the relative phase and relative amplitude of the second pulse and the third pulse, and
  determining the relative phase and relative amplitude of the second pulse and the third pulse as the closest match when applying a quantum sensor model for the second quantum sensor, the model being designed to model the dependencies between the relative phase and amplitude and the resulting population state.

10. The system of claim 9, wherein the first pulse is a continuous pulse signal and the second pulse is processed to a non-continuous pulse signal before being supplied to the first quantum sensor.

11. The system of claim 9, comprising a delay line for the first pulse and/or third pulse.

12. The system of claim 9, wherein the computing unit is arranged to sequentially or parallel perform two measurements with a 90 degree phase shift between the two measurements.

13. The system of claim 9, wherein for the first pulse a Ramsey type pulse sequence is used.

14. The system of claim 9, wherein the first quantum and the at least one second quantum sensor are entangled for stretched population states.

15. The system of claim 9, wherein the control unit is arranged to:
  squeeze the first pulse and measure the amplitude and measure the amplitude, or
  increase the amplitude noise and measure the phase.

16. The system of claim 9, wherein the control unit is designed to produce a multi-frequency first pulse, preferably to determine the frequency response for several frequencies in the pulse at the same time.

17. The system of claim 9, wherein the system is arranged to entangle the first quantum sensor and the at least one second quantum sensor by laser pulses or microwave pulses of a coherent pulse source of the system.

18. The system of claim 9, wherein a frequency of the entanglement is lower than a frequency of the signal to be measured (first pulse).

19. The system of claim 9, wherein a frequency of the entanglement is lower than the read-out frequency.

20. A RF vector measurement method, comprising:
generating a RF pulse,
splitting the pulse into a first pulse send to a device-under-test DUT, and a second pulse send as a reference to a first quantum sensor of the system,
supplying a third pulse, which is produced by reflecting or transmitting the first by the DUT, to at least one second quantum sensor phase-correlated with said first quantum sensor by entanglement,
as a measurement, reading out the state of the population of the first quantum sensor or the second quantum sensor, wherein the state of the first or quantum sensor or of the second quantum sensor is based on the relative phase and relative amplitude of the second pulse and the third pulse, and
determining the relative phase and relative amplitude of the second pulse and the third pulse as the closest match when applying a quantum sensor model for the second quantum sensor, the model being designed to model the dependencies between the relative phase and amplitude and the resulting population state.

* * * * *